United States Patent
Phillips et al.

(10) Patent No.: US 6,447,601 B1
(45) Date of Patent: Sep. 10, 2002

(54) CRYSTAL PULLER AND METHOD FOR GROWING MONOCRYSTALLINE SILICON INGOTS

(75) Inventors: Richard Joseph Phillips, St. Peters; Larry E. Drafall, St. Charles; Kirk D. McCallum, Warrenton, all of MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 0 days.

(21) Appl. No.: 09/811,982

(22) Filed: Mar. 19, 2001

(51) Int. Cl.[7] .............................................. C30B 15/20
(52) U.S. Cl. ........................ 117/13; 65/18.1; 65/18.2; 65/35; 65/71
(58) Field of Search ................ 65/18.1, 18.2, 65/35, 71, 302; 117/13

(56) References Cited

U.S. PATENT DOCUMENTS

| | | |
|---|---|---|
| 4,268,872 A | * 5/1981 | Kokaji et al. ................ 358/301 |
| 4,416,680 A | 11/1983 | Brüning et al. |
| 4,632,686 A | 12/1986 | Brown et al. |
| 4,935,046 A | 6/1990 | Uchikawa et al. |

FOREIGN PATENT DOCUMENTS

| | | |
|---|---|---|
| EP | 0911429 | 4/1999 |
| JP | 08169798 | 7/1996 |
| JP | 08217592 | 8/1996 |
| JP | 08239231 | 9/1996 |
| JP | 08333124 | 12/1996 |

* cited by examiner

*Primary Examiner*—Felisa Hiteshew
(74) *Attorney, Agent, or Firm*—Senniger, Powers, Leavitt & Roedel

(57) ABSTRACT

A crystal puller for growing monocrystalline silicon ingots according to the Czochralski method includes a housing and a crucible in the housing for containing molten silicon. The crucible has a side wall having a transmittance of at least about 80% generally throughout a light wavelength range of about 500 to about 2500 nanometers. A pulling mechanism is included for pulling a growing ingot upward from the molten silicon. In operation, polycrystalline silicon is charged to the crucible and the crucible is heated to melt the polycrystalline silicon for forming a molten silicon melt in the crucible. A seed crystal is then brought into contact with the molten silicon in the crucible and a monocrystalline silicon ingot is pulled up from the molten silicon.

17 Claims, 2 Drawing Sheets

|  | %LLPD MIXED CHARGE (1st PULL) | %LLPD RECHARGE (2nd PULL) | %LLPD RECHARGE (3rd PULL) |
| --- | --- | --- | --- |
| FORMED CLEAR WALL | 0.6 | 0.8 | 0.6 |
| STANDARD ARC FUSED WALL | 2 TO 5 | 2 TO 10 | 2 TO 20 |

CRYSTAL PULLER AND METHOD FOR GROWING MONOCRYSTALLINE SILICON INGOTS

BACKGROUND OF THE INVENTION

The present invention relates generally to a crystal puller and method for growing monocrystalline silicon ingots, and more particularly to such a crystal puller and method in which a crucible having a high heat transmittance is used to contain molten silicon during the growth of monocrystalline silicon ingots in the crystal puller.

Single crystal silicon, which is the starting material for most semiconductor electronic component fabrication, is commonly prepared by the so-called Czochralski ("Cz") method. The growth of the crystal is most commonly carried out in a crystal pulling furnace. In this method, polycrystalline silicon ("polysilicon") is charged to a crucible and melted by a heater surrounding the outer surface of the crucible side wall. A seed crystal is brought into contact with the molten silicon and a single crystal ingot is grown by extraction via a crystal puller. After formation of a neck is complete, the diameter of the crystal ingot is enlarged by decreasing the pulling rate and/or the melt temperature until the desired or target diameter is reached. The cylindrical main body of the crystal which has a generally constant diameter is then grown by controlling the pull rate and the melt temperature while compensating for the decreasing melt level. Near the end of the growth process, the crystal diameter must be reduced gradually to form an end-cone. Typically, the end-cone is formed by increasing the pull rate and heat supplied to the crucible. When the diameter becomes small enough, the ingot is then separated from the melt.

Crucibles used in conventional crystal pullers are commonly constructed of quartz because of its purity, temperature stability and chemical resistance. The side walls of conventional crucibles are substantially "opaque," or more accurately "translucent," throughout their thickness as a result of having a high density of bubbles therein. These bubbles are grown into the crucible wall as a result of conventional manufacturing processes in which quartz particles are heated and fused together in a relatively short time period (otherwise commonly referred to as arc fusing). For example, conventional translucent quartz crucibles are typically produced by a process in which quartz powder is introduced into a mold to form a layer along the inner surface of the mold. The quartz powder is then heated and fused together at the inner surface thereof while the mold is rotated to produce a quartz crucible.

Crucibles manufactured in this manner have a relatively high bubble content, i.e., a relatively high density of bubbles or pockets of gas contained in the crucible side wall near the radially outer half of the wall thickness. Such crucibles typically contain bubbles ranging from about 50–200 microns in diameter, with the average bubble having a diameter of about 100 microns. There are approximately 70,000 bubbles/cm$^3$ in translucent crucibles. These quartz crucibles are advantageous in that they have high strength and are relatively easy to form in large sizes. For these reasons, translucent quartz crucibles are widely utilized.

However, quartz crucibles having a high bubble content, such as the conventional translucent crucibles described above as having a high bubble density throughout the thickness of the crucible side wall, are not without drawbacks. Prolonged exposure, e.g., up to 100 hours or more, of the inner surface of the crucible side wall to the high temperature silicon melt contained therein during crystal growth results in reaction of the silicon melt with the quartz crucible and leads to dissolution of the inner surface of the crucible side wall. This dissolution of the inner surface exposes bubbles in the crucible side wall to the molten silicon. As a result, the bubbles rupture, releasing gases inside the bubbles into the melt as well as quartz particles from the crucible side wall. Exposed pits in the inner surface of the crucible resulting from the ruptured bubbles are also known to promote the formation of crystobalite on the roughened inner surface. The crystobalite can become separated from the crucible and float in the melt. This in turn is a particle that can be slow to dissolve.

Particulates in the melt can come into contact with the growing crystal at the melt interface and be incorporated into the crystal structure. When this happens, a resulting loss of zero dislocation structure in the crystal can occur which will lead to a decreased throughput of crystalline ingots. One measurement of the loss of throughput associated with the use of quartz crucibles is the percentage of wafers manufactured from a crystal ingot which have at least one Large Light Point Defect (LLPD's). A Light Point Defect is a light scattering event off of a polished silicon wafer surface which can be registered by an inspection tool and is the result of a localized topographical deviation from the nominally planar silicon surface. In other words, the Light Point Defect is the result of a particle or pit on the wafer surface that causes an increase in light scattering intensity relative to that of the surrounding wafer surface. Bubbles which cavitate from the crucible can become entrained in the melt and subsequently attach to the liquid/solid interface. This essentially results in a grown in bubble in the crystal. Consequently, when the crystal is sliced into wafers, the cut can progress through the bubble, with a resulting pit on the wafer surface. Light Point Defects that have a large scattering potential, such as pits corresponding to a size of at least 10 microns or more in diameter, are classified as Large Light Point Defects.

To this end, it is conventional in the art to manufacture a translucent, multi-layer quartz crucible comprising an inner layer having a reduced bubble size and/or density and an outer layer having a relatively high bubble density. For example, U.S. Pat. No. 4,632,686 (Brown et al.) discloses a method of manufacturing quartz glass crucibles to have a "low bubble content." This method comprises applying a vacuum pressure to the outer surface of the crucible during heating and fusion of the quartz powder. However, because the bubbles drawn from the inner layer of the crucible encounter substantial resistance in passing through the outer layer, the outer layer of the crucible has a relatively high bubble size and density. An inspection of currently available crucibles manufactured according to this or similar applied vacuum processes reveals that the "low bubble content" provided by such a method includes bubbles having an average size of about 150 microns and a bubble density of about 5000 bubbles/cm$^3$.

U.S. Pat. No. 4,935,046 (Uchikawa et al.) discloses another multi-layer quartz glass crucible in which an outer, or base layer is translucent and an inner layer (e.g., 0.3 mm to 3.0 mm) is substantially transparent. The substantially transparent inner layer is said to be free of bubbles having a diameter greater than 50 microns and bubbles of a diameter between 20 microns and 50 microns do not exist in a concentration of more than 10/cm$^2$. The stated bubble density is given as a surface area measurement without regard to the thickness of the crucible. A volumetric density expressed in bubbles/cm$^3$ would be considerably higher. In any event, when the inner layer of the crucible is dissolved into the melt, particulate contamination of the melt resulting from ruptured bubbles and the growth of crystobalites is reduced. Providing the high bubble density outer layer is said to provide a more uniform heating throughout the inner surface of the crucible so that the crystal pulling operation can be carried out with an improved stability. According to Uchikawa et al., if the bubble concentration in the outer layer is too low, a sufficient diffusion of heat radiated by the crucible heater will not be obtained.

Conventional crucibles such as those disclosed above have had limited success in eliminating all quartz crucible related crystal defects. Due to the long duration of crystal pulling required to produce large diameter crystals, the low bubble content inner layer of the crucible of Uchikawa et al. may be dissolved before crystal growth is complete and the higher bubble density portion of the crucible may then expose more bubbles to the melt.

Moreover, even if the inner layer is sufficiently thick, the outer layer still contains a high density of bubbles. Contrary to the teachings of Uchikawa et al., it has recently been discovered that the size and density of bubbles present in conventional translucent quartz crucibles suppresses the pull rate at which an ingot can pulled up from the melt without distortion of the growing ingot. The bubbles in the crucible tend to increase thermal resistance against heat transmittance from the crucible heater through the crucible side wall to the molten silicon in the crucible. More particularly, the bubbles diffuse and scatter heat energy from the crucible heater, thereby negatively effecting heat transmittance through the crucible to the molten silicon. The result of the low transmittance of conventional crucibles is that the melt becomes increasingly isothermal, i.e., the melt has a relatively low temperature gradient, which is believed to limit the pull rate at which the ingot can be pulled from the melt without distortion.

SUMMARY OF THE INVENTION

Among the several objects and features of the present invention may be noted the provision of a crystal puller and method which increases throughput of monocrystalline silicon ingots grown in the crystal puller; the provision of such a crystal puller and method which allows for increased pull rates without distortion of the ingots; and the provision of such a crystal puller and method which reduces the incidence of Large Light Point Defects in wafers manufactured from ingots grown in the crystal puller.

Generally, a crystal puller of the present invention for growing monocrystalline silicon ingots according to the Czochralski method comprises a housing and a crucible in the housing for containing molten silicon. The crucible includes a side wall having a transmittance of at least about 80% generally throughout a light wavelength range of about 500 to about 2500 nanometers. A pulling mechanism is included for pulling a growing ingot upward from the molten silicon.

A method of the present invention for growing a monocrystalline silicon ingot in a crystal puller of the type used for growing monocrystalline silicon ingots according to the Czochralski method generally comprises charging polycrystalline silicon to a crucible having a side wall. Heat is radiated through the crucible side wall with a transmittance of at least about 80% generally throughout a light wavelength range of about 500 to about 2500 nanometers to melt the polycrystalline silicon for forming a molten silicon melt in the crucible. A seed crystal is brought into contact with the molten silicon in the crucible and a monocrystalline silicon ingot is pulled up from the molten silicon.

Other objects and features of the present invention will be in part apparent and in part pointed out hereinafter.

BRIEF DESCRIPTION OF THE DRAWINGS

Corresponding reference characters indicate corresponding parts throughout the several views of the drawings.

DETAILED DESCRIPTION OF THE PREFERRED EMBODIMENT

Figure 1:
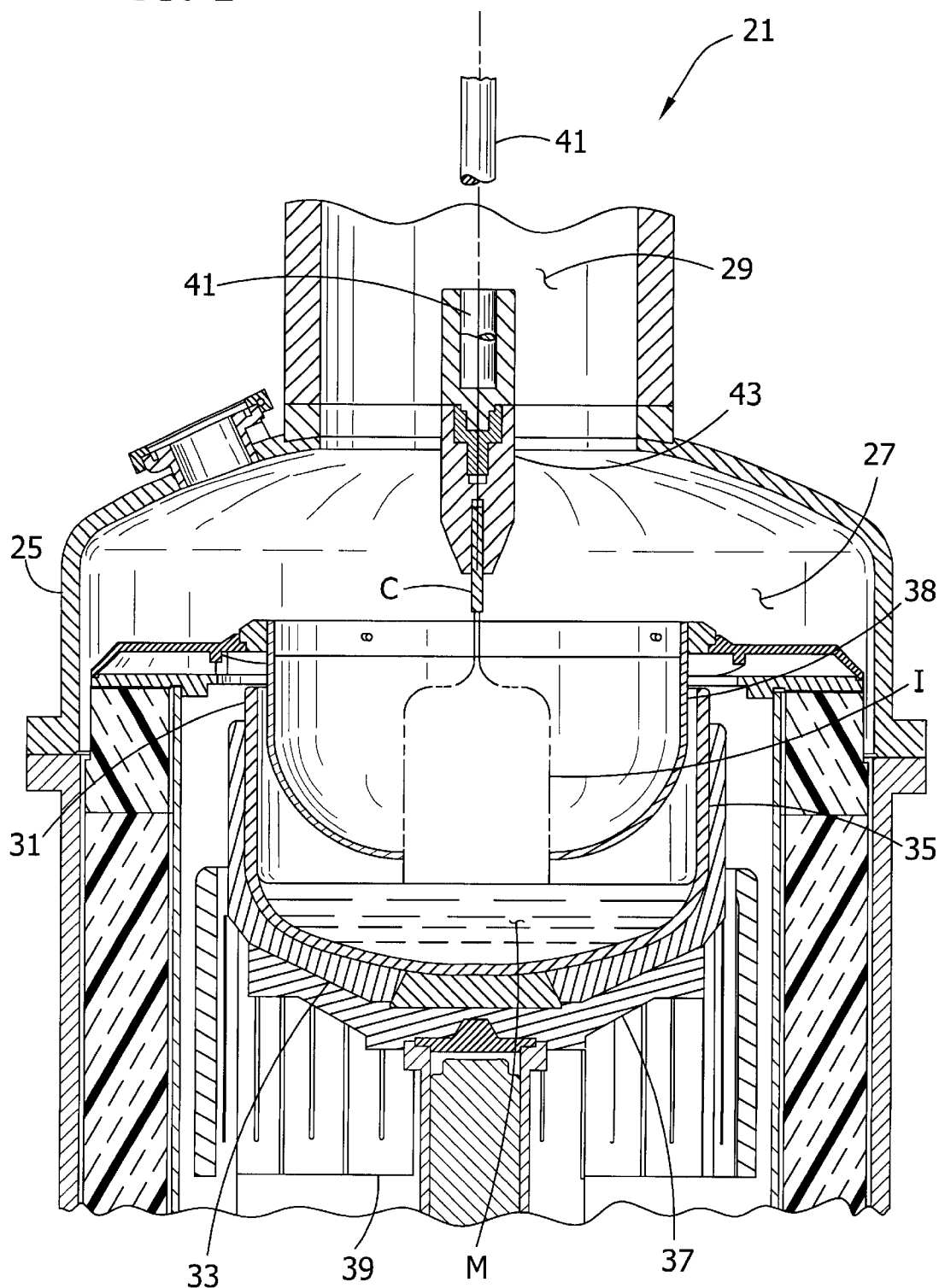
FIG. 1 is a schematic, fragmentary vertical section of a crystal puller of the present invention.

Referring now to the drawings and in particular to FIG. 1, a crystal puller of the present invention of the type used to grow monocrystalline silicon ingots (e.g., ingot I of FIG. 1) according to the Czochralski method is designated in its entirety by the reference numeral 21. The crystal puller 21 includes a water cooled housing, generally indicated at 25, for isolating an interior which includes a lower crystal growth chamber 27 and an upper pull chamber 29 having a smaller transverse dimension than the growth chamber. A quartz crucible 31 seated in a susceptor 33 has a cylindrical side wall 35 and contains molten semiconductor source material M from which the monocrystalline silicon ingot I is grown. The susceptor 33 is mounted on a turntable 37 for rotation of the susceptor and crucible 31 about a central longitudinal axis X. The crucible 31 is also capable of being raised within the growth chamber 27 to maintain the surface of the molten source material M at a generally constant level as the ingot I is grown and source material is removed from the melt. A heat shield 38 is interposed between the crucible side wall 35 and the ingot I as the ingot is grown to shield the ingot from heat radiated by the crucible side wall. An electrical resistance heater 39 surrounds the crucible 31 for heating the crucible to melt the source material M in the crucible. The heater 39 is controlled by an external control system (not shown) so that the temperature of the molten source material M is precisely controlled throughout the pulling process.

A pulling mechanism includes a pull shaft 41 extending down from a mechanism (not shown) capable of raising, lowering and rotating the pull shaft. The crystal puller 21 may have a pull wire (not shown) rather than a shaft 41, depending upon the type of puller. The pull shaft 41 terminates in a seed crystal chuck 43 which holds a seed crystal C used to grow the monocrystalline ingot I. The pull shaft 41 has been partially broken away in FIG. 1, both at its top and where it connects to the chuck 43. In growing the ingot I in accordance with a method of the present invention, the pulling mechanism lowers the seed crystal C until it contacts the surface of the molten source material S. Once the seed crystal C begins to melt, the pulling mechanism slowly raises the seed crystal up through the growth chamber 27 and pull chamber 29 to grow the monocrystalline ingot I. The speed at which the pulling mechanism rotates the seed crystal C and the speed at which the pulling mechanism raises the seed crystal (i.e., the pull rate v) are controlled by the external control system. The general construction and operation of the crystal puller 21, except to the extent explained more fully below, is conventional and known by those of ordinary skill in the art.

The quartz crucible 31 of the crystal puller 21 and method of the present invention is constructed to have a high transmittance through the thickness of the crucible side wall 35. Transmittance, as used herein, refers to the ability of light to transmit through the thickness of the crucible 31 without scatter or diffusion. More particularly the term transmittance as used herein refers to a relative transmittance conventionally measured by directing a beam of light from a light source onto an incident target surface and measuring the electrical signal (e.g., voltage) of the incident light from the surface. An object is then interposed between the light source and the target surface and again the electrical signal of the incident light from the surface is measured. The relative transmittance is then the ratio of the electrical signal measured by directing the light through the object to the electrical signal measured without the object interposed between the light source and the target surface.

Preferably, the crucible 31 is constructed to have a transmittance through the crucible side wall of at least 80% throughout a light wavelength range of about 500 to about 2500 nanometers. This represents a light wavelength range that is most sensitive to light scattering effects. More preferably, the crucible 31 is constructed to have a transmittance through the crucible side wall 35 of at least 80% in the disclosed light wavelength range upon exposure to heat having a temperature of about 1500° C.–1600° C., which is approximately the temperature of the heat which the crucible is exposed to during growth of an ingot I in the crystal puller 21. The disclosed light wavelength range represents approximately 82.4% to 83.6% of the total wavelength range of the heater 39 operating in the temperature range of 1500° C. to 1600° C. Even more preferably, the crucible 31 is constructed to have a transmittance through the crucible side wall 35 of at least 80% throughout the disclosed light wavelength range upon exposure to heat having a temperature of about 1500° C.–1600° C. for a duration of at least 48 hours. Still more preferably, the crucible 31 is constructed to have a transmittance of at least about 90% throughout the disclosed light wavelength range, and in particular upon exposure to heat having a temperature of about 1500° C.–1600° C. for a duration of at least 48 hours.

The crucible 31 of the illustrated embodiment is a transparent crucible constructed of clear fused quartz, which is conventionally manufactured by fusing quartz particles into tubing using a process by which the particles are heated for an extended period of time sufficient to remove constituents that tend to result in the formation of bubbles in the tubing. The tubing is then formed into a crucible by heating the tubing and using conventional forming techniques to form the tubing into the bowl shape of the crucible. One preferred such crucible is formed by Quartz Scientific, Inc. of Fairport Harbor, Ohio. However, it is understood that the crucible 31 may be constructed other than of clear fused quartz, as long as the transmittance through the side wall 35 of the crucible is as disclosed above. Also, the crucible 31 of the illustrated embodiment has a side wall 35 thickness in the range of about 3.5–6 mm. However, it is understood that the crucible 31 may have a side wall 35 thickness falling above or below this range without departing from the scope of this invention.

The high transmittance of the crucible 31 is a result of a substantially lower density of bubble defects in the crucible side wall 35. As an example, the number and size of bubble defects in a clear fused quartz crucible was measured with a microscope capable of resolving details (i.e., to have details substantially in focus to one's eye) down to about 12 microns in size, and then down to about 2 microns in size. Using this microscope, no bubble defects having a diameter equal to or greater than about 2 microns were detected in the clear fused quartz crucible. It is suspected that the clear fused quartz crucible 31 may be substantially free of bubbles having a diameter less than 2 microns. However, due to limitations of the measuring equipment this could not be verified. For comparison purposes, currently available translucent quartz crucibles have approximately 2,000–10,000 bubbles/cm$^3$ of at least 14 microns in diameter. The inner layer of such translucent quartz crucibles are known to have at least 1–2 bubbles/cm$^3$ of at least about 40–50 microns in size.

Figures 2, 3:
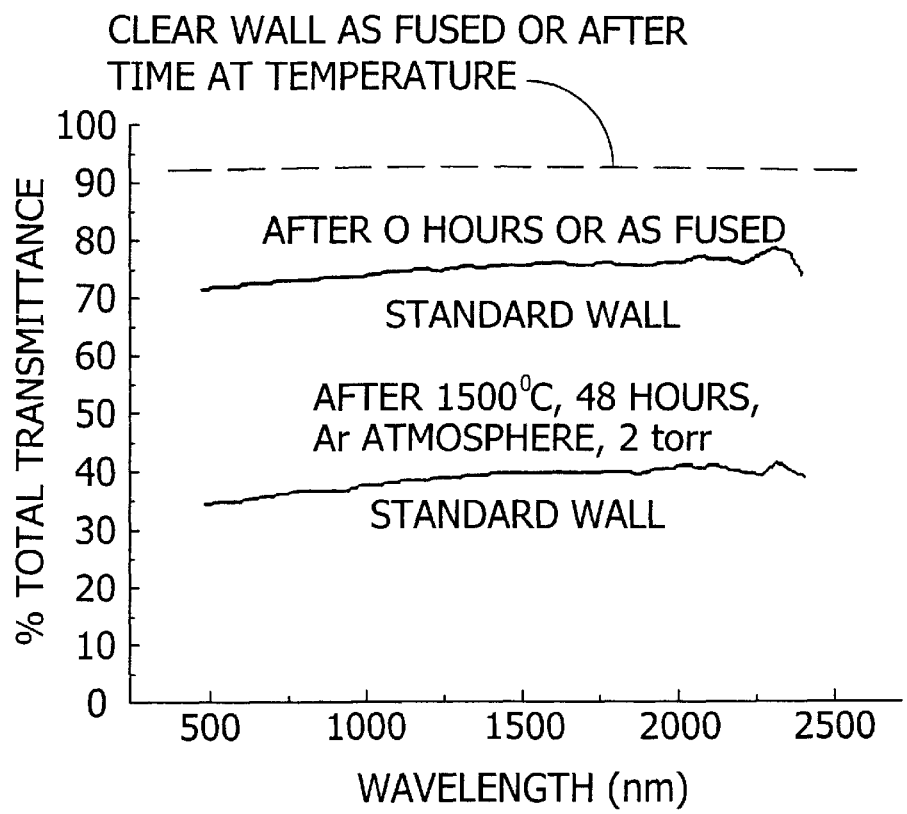
FIG. 2 is a comparison of the transmittance of a crucible of the crystal puller of FIG. 1 constructed of clear fused quartz to that of a conventional crucible.
FIG. 3 is a table comparing the incidence of LLPDs in wafers processed from ingots grown in a crystal puller a crucible constructed to have a high transmittance with the incidence of LLPD's in wafers processed from ingots grown in a crystal puller incorporating a conventional crucible.

FIG. 2 compares the transmittance of a crucible 31 constructed of clear fused quartz to that of a conventional translucent crucible having an inner layer of low bubble density and an outer layer of higher bubble density. To determine the transmittance of the conventional crucible, a core sample having a thickness of about 4 mm was taken transversely (e.g. radially) inward through the high bubble density outer layer of the crucible. The transmittance of the core sample was measured as described above before being heated and is indicated as the upper solid line in FIG. 2. It can be seen that the transmittance of the core sample before being heated is less than 80% in the light wavelength range of about 500–2500 nanometers. The sample was then subjected to heat having a temperature of about 1500° C. under conditions simulating that of a crystal puller for a period of about 48 hours. The transmittance of the sample was again measured and is indicated as the lower solid line in FIG. 2. It can be seen that the transmittance of the sample decreased substantially, e.g., down to less than 40%, upon being exposed to the high temperature for a prolonged duration. This is a result of the bubbles in the sample growing as the sample is heated. It is also understood that the inner layer of the crucible from which the sample was taken has a relatively lower bubble density than the outer layer. However, because such bubbles are present, the transmittance of a core sample taken through the full thickness of the crucible side wall would be even less than that indicated in FIG. 2.

The transmittance of the clear fused quartz crucible 31 is based on characteristic properties of clear fused quartz as indicated by the reference University Physics, 9th Edition, by Hugh D. Young and Roger A. Freedman, published by Addison-Wesley, and is indicated as a dotted line in FIG. 2. Because the clear fused quartz has substantially no bubble defects equal to or greater than about 2 microns, there is little scattering or diffusion of heat by the material. The transmittance of the clear fused quartz is presumed to be the substantially the same before and after it is heated because the absence of bubbles grown into the crucible results in the lack of growth of bubbles upon heating of the crucible. According to the known characteristics of clear fused quartz, a 4% reduction in transmittance results from each surface (inner and outer) of the crucible side wall 35. Thus, as shown in FIG. 2, the transmittance of the clear fused quartz is above 90%, and more particularly is indicated as being 92%. It is understood, however, that the characteristics set forth in the disclosed reference are based on exposure of the clear fused quartz surface to air, and that the transmittance of the clear fused quartz crucible 31 may be other than about 92% since the inner surface of the crucible side wall 35 is exposed instead to the molten source material M.

Experiment 1

Ingots were grown in a conventional crystal puller under conditions in accordance with a fast pull growth process. A fast pull growth process is one in which the ingot is pulled up from the melt substantially at as high a pull rate as possible without resulting in distortion (e.g. a reduced diameter) during growth of the ingot. All of the structure and operating parameters were substantially the same as those used in growing ingots in a crystal puller that incorporates a conventional crucible. However, the crucible 31 used in this experiment was constructed of clear fused quartz. The susceptor 33 used for seating the crucible in the crystal puller was conventionally constructed of isostatically molded graphite and the crucible heater 39 was a conventional 22 inch electrical resistance heater having a power capability of about 200 kW. For a first pull, the pull rate at which the ingot I was pulled up from the molten silicon M in the clear fused quartz crucible 31 was about 10% greater than the pull rate used to grow monocrystalline silicon ingots in a crystal puller incorporating a conventional crucible. The ingot I was inspected for distortion and it was determined that no distortion had occurred as a result of the increased pull rate.

In a second pull, another ingot was grown in the same crystal puller under the same conditions but with the pull rate increased to about 20% over the pull rate at which ingots are typically grown in a crystal puller incorporating a conventional crucible. This second ingot was inspected and some distortion was found to have occurred. Thus, based on the results of this experiment, incorporating the clear fused quartz crucible into the crystal puller resulted in an increased pull rate for a fast pull type growth process in the range of about 10%–20%.

Without being bound to a particular theory, it is believed that the increased pull rate is a result of the higher transmittance accorded by the crucible 31 having a transmittance of at least 80% in the disclosed light wavelength range. More particularly, using such a crucible 31 substantially increases the rate of transmission of heat radiated from the crucible heater 39 through the crucible side wall 35 to the molten silicon M in the crucible. The increased rate of transmission of radiant heat allows the melt M to take on a temperature gradient profile that is substantially less isothermal than the temperature gradient profile of a melt associated with using a conventional crucible having a relatively low transmittance. In other words, the axial temperature gradient of the melt M is increased, with the temperature of the melt decreasing from the bottom of the melt toward the melt surface.

According to "Semiconductor Silicon Crystal Technology" by Fumio Shimura, Academic Press, 1988, the maximum pull rate at which an ingot can be pulled up from the silicon melt without distortion is proportional to the difference between the axial temperature gradient of the crystal at the melt surface and the axial temperature gradient of the melt. Expressed otherwise, the relationship between the maximum pull rate without distortion and the temperature gradient of the melt is given as:

$$[G_p]_{c,max} \propto \left| \left(\frac{dT}{dz}\right)_c - \left(\frac{dT}{dz}\right)_m \right|$$

Where $[G_p]_{c,max}$ is the maximum pull rate, $(dT/dz)_c$ is the axial temperature gradient in the crystal and $(dT/dz)_m$ is the temperature gradient in the melt. The sign convention is negative for both the crystal temperature gradient and the melt temperature gradient. Thus, for a fixed axial temperature gradient of the crystal at the melt surface, the maximum pull rate at which the ingot can be pulled up from the melt increases as the temperature gradient of the melt increases. Since the higher transmittance of the crucible 31 results in an increased temperature gradient of the melt M, the maximum pull rate without distortion can be increased accordingly. Also, since the transmittance of the crucible 31 is substantially greater than the transmittance of a conventional crucible, the power supplied to the crucible heater 39 for heating the molten silicon M could be decreased without negatively effecting ingot growth.

Experiment 2

Three runs, or pulls, were performed to grow three monocrystalline ingots in a crystal puller configured substantially as described above for Experiment 1. For growing the first ingot, a mix of granular and chunk polycrystalline silicon was charged to the crucible 31 and melted before the ingot was pulled up from the melt. After the first ingot was removed from the crystal puller, the crucible 31 (still containing some molten silicon following growth of the first ingot) was recharged with granular polycrystalline silicon and the second ingot was grown. The crucible 31 was then recharged again with granular polycrystalline silicon and the third ingot was grown.

Each of the ingots was sliced into wafers and the wafers were processed to a polished surface. A conventional light measuring tool was used to inspect the surfaces of the wafers for Large Light Point Defects (LLPDs). As used herein, the term Large Light Point Defects refers to a light scattering event that correlates to a pit in the wafer surface having a diameter of at least 10 microns or larger. FIG. 3 is a table comparing the incidence of LLPDs in the wafers processed from the ingots grown in the crystal puller with the high transmittance crucible 31 with LLPD incidence for wafers processed from ingots grown in a crystal puller incorporating a conventional crucible. The data is provided in terms of the percentage (e.g., %LLPD) of wafers manufactured from each respective ingot that were detected by the light measuring tool as having at least one LLPD. The data for wafers manufactured from ingots grown in a crystal puller incorporating a conventional crucible is based on historical data.

As shown in the table, regardless of the make-up of the polycrystalline silicon charged to the crucible (chunk and/or granular), the percentage of wafers indicated as having at least one LLPD defect was less than 1% for wafers processed from the ingots grown in the crystal puller having the high transmittance crucible. A percentage measurement of less than 1% is considered to be a zero incidence level within the noise level of the measurement tool. As a comparison, for wafers processed from ingots grown in crystal pullers having a conventional crucible the incidence of wafers having at least one LLPD is in the range of 2%–5% for the initial pull and in the range of 2%–20% for subsequent pulls.

It will be observed from the foregoing that the crystal puller and method described herein satisfies the various objectives of the present invention and attains other advantageous results.

When introducing elements of the present invention or the preferred embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above constructions without departing from the scope of the invention, it is intended that all matter contained in the above description or shown in the accompanying drawings shall be interpreted as illustrative and not in a limiting sense.

What is claimed is:

1. A method of growing a monocrystalline silicon ingot in a crystal puller used for growing monocrystalline silicon ingots according to the Czochralski method; the method comprising the steps of:

charging polycrystalline silicon to a crucible having a side wall;

radiating heat through the crucible side wall with a transmittance of at least about 80% generally throughout a light wavelength range of about 500 to about 2500 nanometers to melt the polycrystalline silicon for forming a molten silicon melt in the crucible;

bringing a seed crystal into contact with the molten silicon in the crucible; and pulling a monocrystalline silicon ingot up from the molten silicon.

2. A method as set forth in claim 1 wherein the step of radiating heat includes maintaining a transmittance of at least about 80% generally throughout a light wavelength range of about 500 to about 2500 nanometers of the crucible side wall after being exposed to heat having a temperature of at least about 1500° C.

3. A crystal puller as set forth in claim 1 where the step of radiating heat includes maintaining a transmittance of at least about 90% generally throughout a light wavelength range of about 500 to about 2500 nanometers.

4. A. A method as set forth in claim 1 wherein the step of charging polycrystalline silicon to a crucible comprises charging the polycrystalline silicon to a crucible having a side wall having a bubble density of less than about 2 bubbles/cm$^3$ having a diameter equal to or greater than about 40 microns.

5. A method as set forth in claim 4 wherein the step of charging polycrystalline silicon to a crucible comprises charging the polycrystalline silicon to a crucible having a side wall substantially free of bubbles having a diameter equal to or greater than about 12 microns.

6. A method as set forth in claim 5 wherein the step of charging polycrystalline silicon to a crucible comprises charging the polycrystalline silicon to a crucible having a side wall substantially free of bubbles having a diameter equal to or greater than about 2 microns.

7. A method as set forth in claim 1 wherein the step of charging polycrystalline silicon to a crucible comprises charging the polycrystalline silicon to a crucible constructed of clear fused quartz.

8. A method as set forth in claim 7 wherein the step of charging polycrystalline silicon to a crucible further comprises charging the polycrystalline silicon to a crucible having a side wall thickness in the range of about 3.5 mm–6 mm.

9. A crystal puller for growing monocrystalline silicon ingots according to the Czochralski method, the crystal puller comprising:

a housing;

a crucible in the housing for containing molten silicon, the crucible including a side wall having a transmittance of at least about 80% generally throughout a light wavelength range of about 500 to about 2500 nanometers; and a pulling mechanism for pulling a growing ingot upward from the molten silicon.

10. A crystal puller as set forth in claim 9 wherein the crucible side wall has a transmittance of at least about 80% generally throughout a light wavelength range of about 500 to about 2500 nanometers after being exposed to heat having a temperature of at least about 1500° C.

11. A crystal puller as set forth in claim 10 wherein the crucible side wall has a transmittance of at least about 80% generally throughout a light wavelength range of about 500 to about 2500 nanometers after being exposed to heat having a temperature of at least about 1500° C. for a time period of about 48 hours.

12. A crystal puller as set forth in claim 9 where the crucible side wall has a transmittance of at least about 90% generally throughout a light wavelength range of about 500 to about 2500 nanometers.

13. A crystal puller as set forth in claim 9 wherein the crucible side wall has a bubble density of less than about 2 bubbles/cm$^3$ having a diameter equal to or greater than about 40 microns.

14. A crystal puller as set forth in claim 13 wherein the crucible side wall is substantially free of bubbles having a diameter equal to or greater than about 12 microns.

15. A crystal puller as set forth in claim 14 wherein the crucible side wall is substantially free of bubbles having a diameter equal to or greater than about 2 microns.

16. A crystal puller as set forth in claim 9 wherein the crucible is constructed of clear fused quartz.

17. A crystal puller as set forth in claim 16 wherein the crucible side wall has a thickness in the range of about 3.5 mm–6 mm.

* * * * *